US006281585B1

(12) United States Patent
Bothra

(10) Patent No.: US 6,281,585 B1
(45) Date of Patent: Aug. 28, 2001

(54) AIR GAP DIELECTRIC IN SELF-ALIGNED VIA STRUCTURES

(75) Inventor: Subhas Bothra, Fremont, CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/439,098

(22) Filed: Nov. 12, 1999

Related U.S. Application Data

(63) Continuation-in-part of application No. 08/884,795, filed on Jun. 30, 1997, now Pat. No. 6,133,635.

(51) Int. Cl.[7] .................................................. H01L 23/48
(52) U.S. Cl. ............................ 257/758; 257/522; 257/788
(58) Field of Search .................................. 257/522, 788, 257/758

(56) References Cited

U.S. PATENT DOCUMENTS

| | | | |
|---|---|---|---|
| 4,997,746 | 3/1991 | Greco et al. | 430/314 |
| 5,439,847 | 8/1995 | Chittipeddi et al. | 437/192 |
| 5,641,712 * | 6/1997 | Grivna et al. | 438/624 |
| 5,759,913 | 6/1998 | Fulford, Jr. et al. | 438/624 |
| 5,792,706 | 11/1998 | Michael et al. | 438/626 |
| 5,814,555 | 9/1998 | Bandyopadhyay et al. | 438/619 |
| 5,869,880 | 2/1999 | Grill et al. | 257/522 |
| 5,900,668 * | 5/1999 | Wollesen | 257/522 |
| 5,955,786 * | 9/1999 | Avanzino et al. | 257/758 |
| 6,078,088 * | 9/1999 | Buynoski | 257/410 |
| 6,100,205 * | 8/2000 | Liu et al. | 438/788 |
| 6,200,900 * | 3/2001 | Kitch . | |

OTHER PUBLICATIONS

S. Wolf and R. Tauber, "Silicon Processing for the VLSI Era", vol. 1, Lattice Press, Sunset Beach, California.

Bothra, Rogers, Kellam, and Osburn, "Analysis of the Effects of Scaling on Interconnect Delay in ULSI Circuits", Transactions on Electron Devices, vol. 40, No. 3, IEEE 3–93.

Fleming and Roherty–Osmun, "Use of Air Gap Structures to Lower Intralevel Capacitance", Feb. 10–11, 1997, DUMIC Cat. No. 97ISMIC–222D, DUMIC Conf., Santa Clara, California.

* cited by examiner

Primary Examiner—C. Everhart
(74) Attorney, Agent, or Firm—Martine & Penilla, LLP

(57) ABSTRACT

A high speed interconnect structure and methods for making the structure are provided. The interconnect structure includes a first metallization layer having a plurality of metallization lines and a conductive via metallization layer defined over the first metallization layer. The conductive via metallization layer is configured to define self-aligned conductive vias. A non-conformal oxide layer is defined over the first metallization layer and the conductive via metallization layer such that air gaps are positioned between the plurality of metallization lines. A cap oxide layer is then defined over the non-conformal oxide. In this example, a CMP operation can be performed to expose the top surfaces of the conductive vias before a next metallization layer is defined. It should be noted that air gaps are defined without the problems associated with conductive via misalignment.

13 Claims, 14 Drawing Sheets

AIR GAP DIELECTRIC IN SELF-ALIGNED VIA STRUCTURES

CROSS REFERENCE TO RELATED APPLICATIONS

This application is a 35 U.S.C. §120 continuation in-part of U.S. Pat. application Ser. No. 08/884,795 filed Jun. 30, 1997 now U.S. Pat. No. 6,133,635, entitled "PROCESS FOR MAKING SELF-ALIGNED CONDUCTIVE VIA STRUCTURES," and naming Subhas Bothra and Jacob Haskell as inventors. The contents of this pending application are incorporated herein by reference for all purposes.

BACKGROUND OF THE INVENTION

1. Field of the Invention

The present invention relates generally to semiconductor circuits and, more particularly, to a method for making and the resulting structure having high speed interconnect lines that incorporate air-gaps.

2. Description of the Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices, such as MOS transistors.

One problem with conventional metal interconnect structures is misalignments introduced in the photolithography process. Via holes are typically defined through a dielectric layer with the purpose of forming an "electrical" metal contact between a layer underlying the dielectric layer and a layer overlying the dielectric layer. As circuits become increasingly smaller and dense, interconnect structures between successive patterned metal layers have also become ever more dense. Unfortunately, conventional photolithography techniques are also being pushed to their limit, which has had the effect of introducing misalignments between patterned layers.

FIG. 1A is a cross sectional view of a conventional semiconductor device having a misaligned metal contact 28. The semiconductor device includes a semiconductor substrate 10 having diffusion regions 12 and a polysilicon gate 14 defined between the diffusion regions. A first dielectric layer 19 is deposited over the semiconductor substrate 10, the diffusion regions 12 and the polysilicon gate 14. Via holes are defined through the first dielectric layer 19 down to the polysilicon gate 14 and the diffusion region 12 (i.e., source/drain). The via holes are then conductively filled with tungsten or metal to define conductive contacts 16 and 18. In this example, conductive contacts 16 and 18 are somewhat misaligned, but no significant electrical problem occurred in this case. However, serious misalignments are shown to have occurred in the patterning of a conductive contact 28, which is defined through a second dielectric layer 22.

As can be appreciated, these type of misalignments are becoming ever more prevalent as device feature sizes continue to shrink. As illustrated, the misalignment of conductive contact 28, which is used to interconnect a metal-1 line 24 to a metal-2 line 30, may cause electrical shorts between adjacently patterned features. By way of example, when interconnect density patterns increase, layout "design rules" that are used by designers to determine the closest possible inter-feature spacings are necessarily pushed to their limits. That is, although features are designed to be adequately spaced apart to avoid electrical shorts between features, misalignments (which are unavoidable in dense photolithography patterning) will cause features to be laid out in arrangements that seriously violate minimum inter-feature separations dictated the design rules.

It is also known that interconnect speed is dependent on many factors such as metal density, the number of metal levels, interconnect lengths, interconnect geometry, active device characteristics, etc. However, for a given interconnect system, the speed is directly determined by the interconnect resistance, the capacitance and the drive current. From the material aspect, the dominant factor is the permittivity of the dielectric (or insulating material) material used in the interconnect system. The dielectric material surrounds the interconnect lines and contributes to the parasitic capacitance of the interconnect. This parasitic capacitance is directly proportional to the dielectric constant of the insulator. As is well known, a reduction in the dielectric constant results in increased interconnect speed and also lowers the power dissipated in the interconnects (i.e., the different metal layers). This realization has led to substantial activity in the field of low dielectric constant materials for applications in integrated circuits.

The relative dielectric constant of silicon dioxide (the most commonly employed insulator in integrated circuits) is about 4.0. All of the materials currently being researched for applications as low dielectric constant materials have relative dielectric constants in the range of 2.0 to 4.0. The material with the lowest dielectric constant, however, is air, with a relative dielectric constant of 1. Thus the use of air as the dielectric would provide the most benefit. This, of course, has been widely recognized in the industry.

Recently, the use of air-gaps between metal lines has been proposed as a possible solution. See for example an article entitled "USE OF AIR GAP STRUCTURES TO LOWER INTRALEVEL CAPACITANCE" by J.G. Fleming, et al., DUMIC Conference 222D/97/0139 (1997), which defines conventional uses of air-gaps to lower the dielectric constant. This article is incorporated herein by reference. Although the implementation of air-gaps can help in reducing capacitance, the fabrication of conventional air-gaps is not practical for several reasons. One such reason is that the size and location of the formed air-gaps depend on the spacing between adjacent metal interconnect lines. When the spacings grow to a particular width, the air-gaps extend upward (i.e., are formed at a higher level) above the level of the metal lines. During subsequent CMP processing the air-gaps can open up trapping residues and/or forming stringers at subsequent via metal deposition, which can result in yield reductions.

FIG. 1B illustrates a problem that may occur when air-gaps are intentionally fabricated between metal lines and misalignments in the conductive vias occur. For instance, a substrate 50 is shown having metal lines 54 and 56. A dielectric layer 52 is then deposited over the metal lines 54 and 56 such that an air-gap 62 is formed. In this example, the air-gap 62 is shown to have moved above the metal lines 54 and 56, however, the level of the dielectric layer 52 is still thick enough that the air-gap 62 is not exposed due to a chemical mechanical polishing (CMP) operation that is used to planarize the top of dielectric layer 52. Because misalignments in conductive vias 58 and 60 is common, when the via holes are formed through the dielectric layer 52, a path to the air-gap 62 is defined.

As shown in a top view of FIG. 1C, the misalignment of the via holes used to form the conductive vias 58 and 60 can be at different location along the metal lines 54 and 56. It should be noted that when the via holes are defined and the path to the air-gap 62 is made, process gases and other chemicals can get trapped within the air-gap 62. Still further, when a tungsten deposition is performed to fill the via holes, the tungsten deposition, which is a chemical vapor deposition (CVD) operation, can cause tungsten to line the inner walls 64 of the air-gap 62. When this happens, a conductive link can be formed through the tungsten covered air-gap 64 and the conductive vias 58 and 60 may inadvertently be electrically connected (i.e., causing an electrical short). If this occurs, the entire fabricated circuit can fail to operation for its intended purpose, which will therefore cause a significant drop in yield.

Accordingly, in view of the foregoing, there is a need for a method for making high speed interconnect structures that incorporate air-gaps, however, without having the problems associated with conductive via misalignment.

SUMMARY OF THE INVENTION

Broadly speaking, the present invention fills these needs by providing a method of making high performance interconnect structures having air-gaps. It should be appreciated that the present invention can be implemented in numerous ways, including as a process, an apparatus, a system, a device, or a method. Several inventive embodiments of the present invention are described below.

In one embodiment, an interconnect structure is disclosed. The interconnect structure includes a first metallization layer having a plurality of metallization lines and a conductive via metallization layer defined over the first metallization layer. The conductive via metallization layer is configured to define self-aligned conductive vias. A non-conformal oxide layer is defined over the first metallization layer and the conductive via metallization layer such that air gaps are positioned between the plurality of metallization lines. A cap oxide layer is defined over the non-conformal oxide. In this embodiment, a CMP operation can be performed to expose the top surfaces of the conductive vias before a next metallization layer is defined. It should be noted that air gaps are defined without the problems associated with conductive via misalignment.

In another embodiment, a method of making an interconnect structure is disclosed. The method includes providing a substrate and forming a plurality of metallization lines on a first level. Self-aligned vias are then formed over the plurality of metallization lines. A conformal oxide layer is then deposited over the plurality of metallization lines and the self-aligned vias, such that air-gaps are formed at least between some of the plurality of metallization lines. The air-gaps therefore provide for higher speeds and performance for the interconnect structure. In this preferred embodiment, the method also includes depositing a cap oxide layer over the conformed oxide layer to fill high aspect ratio regions without forming voids and then performing a CMP operation down to the conductive vias.

In yet another embodiment, an interconnect structure of a semiconductor chip is disclosed. The interconnect structure includes: (a) a metallization layer having a plurality of metallization lines defined over an under-layer, (b) a conductive via metallization layer defined over the first metallization layer, such that the conductive via metallization layer defines self-aligned conductive vias; (c) a non-conformal oxide layer defined over the first metallization layer, and the conductive via metallization layer defines air gaps that are positioned between at least some of the plurality of metallization lines; and (d) an HDP oxide layer defined over the non-conformal oxide. The HDP oxide layer is configured to fill topographical variations between the conductive via metallization layer before a CMP operation is performed.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a method of making high speed interconnect structures is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In the following discussion will first include reference to FIGS. 2–5K, which define methods for making self-aligned via structures. FIGS. 6A–7C will then focus on the fabrication of air-gaps between metallization lines that implement the self-aligned via structures.

Figure 2:
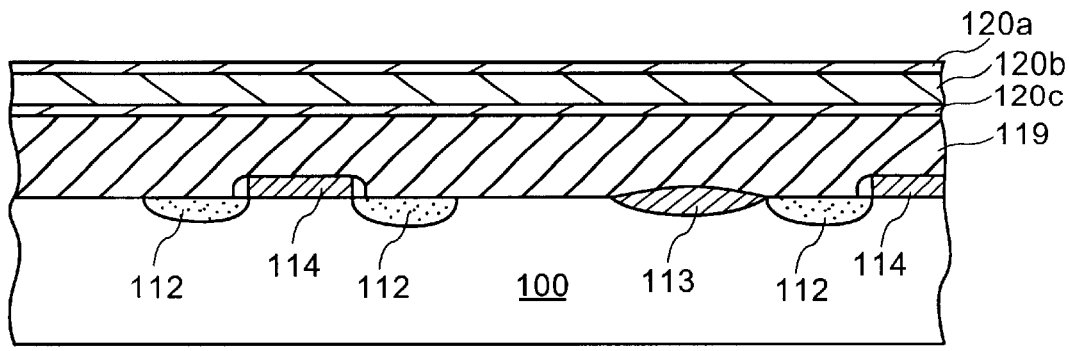
FIG. 2 is a cross sectional view of a semiconductor substrate having a number of active devices and fabricated layers in accordance with one embodiment of the present invention.

FIG. 2 is a cross sectional view of a semiconductor substrate 100 having a number of active devices and fabricated layers in accordance with one embodiment of the present invention. As shown, the semiconductor substrate 100 has diffusion regions 112 formed into the semiconductor substrate 100 and associated polysilicon gates 114. Also shown is a field oxide 113 typically implemented to separate adjacent active devices in a semiconductor design. A first dielectric layer 119 is deposited over portions of the semiconductor substrate 100, diffusion regions 112, polysilicon gates 114, and field oxide 113. Generally, first dielectric layer 119 may be any commonly used dielectric, such as a deposited silicon dioxide ($SiO_2$) layer that is subsequently planarized to provide a substantially even top surface for subsequently deposited layers. By way of example, the first dielectric layer 119 may be planarized using a chemical mechanical polishing (CMP) technique, or any other suitable technique suitable to provide a substantially planer top surface.

Once planarized, a bottom barer layer 120c is deposited over the first dielectric layer 119 to a preferred thickness of between about 100 angstroms and about 800 angstroms. More preferably, the bottom barrier layer 120c is deposited to a thickness of between about 150 angstroms and 500 angstroms, and most preferably to a thickness of about 200 angstroms. In this embodiment, the bottom barrier layer 120c is a titanium nitride (TiN) layer evenly deposited over the top surface of the first dielectric layer 119. Of course, other suitable barrier layers may be used as well, such as titanium (Ti), or a titanium/titanium nitride (Ti/TiN) combination.

Once the bottom barrier layer 120c has been deposited, an interconnect metallization layer 120b, which is preferably an aluminum/copper (Al/Cu) mixture containing about 99.5% aluminum and about 0.5% copper is deposited over the bottom barrier layer 120c. The interconnect metallization layer 120b is preferably deposited to a thickness of between about 3,000 angstroms and about 10,000 angstroms, and more preferably between about 4,000 angstroms and 7,000 angstroms, and most preferably about 5,000 angstroms. Next, a top barrier layer 120a, which is preferably titanium nitride (TiN) having a thickness of between about 100 angstroms and 800 angstroms, and more preferably between about 150 angstroms and 600 angstroms, and more prefer- ably about 300 angstroms is applied over the interconnect metallization layer 120b. The top barrier layer 120a may also be a combination of titanium and titanium nitride (Ti/TiN). Further, the top barrier layer 120a is a good anti-reflective layer (ARC) material that assists in improving photolithography patterning precision. As will be described below, layers 120a, 120b, and 120c will be subsequently patterned to form a first level of metallization interconnect lines, that may be used to interconnect devices formed in semiconductor substrate 100. Accordingly, conductive vias down to the polysilicon gates 114 and diffusion regions 112 are not shown for ease of description.

Figure 3:
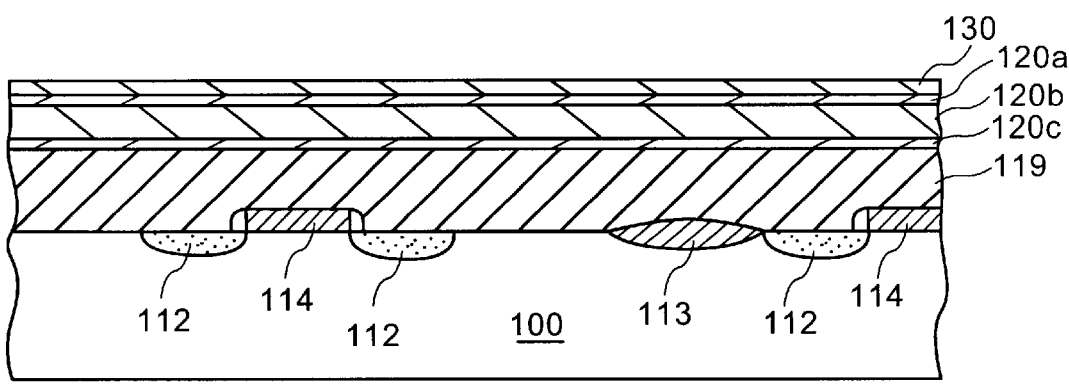
FIG. 3 shows the cross sectional view of FIG. 2 after an etch stop layer is deposited over a top barrier layer in accordance with one embodiment of the present invention.

FIG. 3 shows the cross sectional view of FIG. 2 after an etch stop layer 130 is deposited over the top barrier layer 120a in accordance with one embodiment of the present invention. Etch stop layer 130 is preferably a titanium tungsten (TiW) layer having a thickness of between about 200 angstroms and 1,000 angstroms, and more preferably between about 300 angstroms and about 800 angstroms, and most preferably about 600 angstroms. In another embodiment, the etch stop layer 130 may also be a tungsten (W) layer or a tungsten silicide ($WSi_2$) layer suitable for stopping a $Cl_2/BCL_3$ etch chemistry, which will be described in greater detail below with reference to FIG. 5B and table A.

Figure 4:
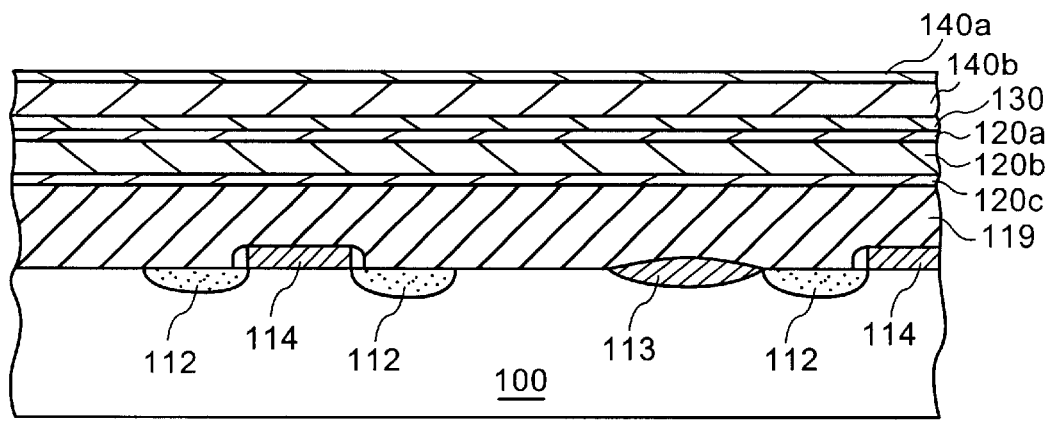
FIG. 4 shows the cross sectional view of FIG. 3 after a conductive via metallization layer and an anti-reflective layer have been successively deposited over the etch stop layer in accordance with one embodiment of the present invention.

FIG. 4 shows the cross sectional view of FIG. 3 after a conductive via metallization layer 140b and a top barrier layer 140a have been successively deposited over the etch stop layer 130. Preferably, conductive via metallization layer 140b is an aluminum/copper (Al/Cu) mixture similar to that of interconnect metallization layer 120b described above. Preferably, conductive via metallization layer 140b is deposited to a, thickness of between about 3,000 angstroms and about 10,000 angstroms, and more preferably between about 4,000 angstroms and 7,000 angstroms, and most preferably about 5,000 angstroms.

Once conductive via metallization layer 140b has been deposited to an appropriate thickness, the top barrier layer 140a, being a titanium nitride (TiN) layer is deposited to a thickness of between about 100 angstroms and about 800 angstroms, and most preferably between about 150 angstroms and about 600 angstroms, and most preferably about 300 angstroms. In this embodiment, top barrier layer 140a is similar to that of top barrier layer 120a, which may also be a combination of titanium and titanium nitride (Ti/TiN). As mentioned above, the top barrier layer 140a is a good anti-reflective layer (ARC) material that assists in improving photolithography patterning operations. As will be shown below, conductive via metallization layer 140b and top barrier layer 140a will be subsequently patterned to define self-aligning conductive vias which are preferably used to electrically interconnect to the patterned interconnect lines formed from the first metallization layers 120a, 120b, and 120c.

Figure 5A:
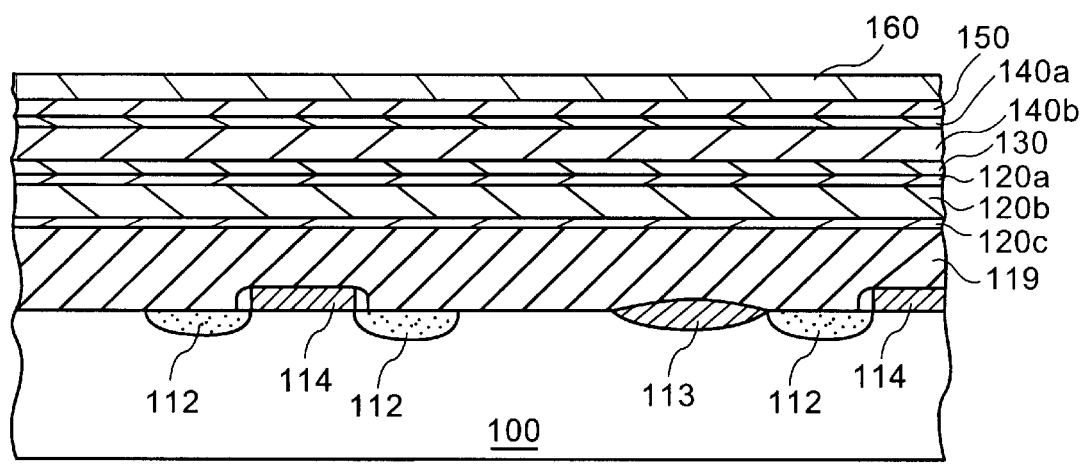
FIG. 5A shows the cross sectional view of FIG. 4 after a hard mask layer and photoresist layer have been successively deposited over the anti-reflective layer in accordance with one embodiment of the present invention.

FIG. 5A shows the cross sectional view of FIG. 4 after a hard mask layer 150, which is preferably a silicon nitride (SiN) layer, is deposited over the top barrier layer 140a in accordance with one embodiment of the present invention. Preferably, the hard mask is deposited to a thickness of between about 500 angstroms and about 2,000 angstroms, and more preferably between about 700 angstroms and about 1,500 angstroms, and most preferably about 1,000 angstroms. In one embodiment, hard mask layer 150 will be subsequently used for patterning the resulting conductive vias formed from patterning conductive via metallization layer 140b and top barrier layer 140a as shown in FIG. 5J below. Other suitable materials for hard mask layer 150 may be a silicon dioxide ($SiO_2$) layer or a silicon oxy nitride (SiON) layer deposited to about the same thickness as the silicon nitride (SiN) layer.

After the hard mask layer 150 has been deposited, a photoresist layer 160 is spin coated over the top surface of hard mask layer 150. In one embodiment, the photoresist layer 160 is applied to a thickness of between about 3,000 angstroms and about 15,000 angstroms, and more preferably between about 4,000 angstroms and about 9,000 angstroms, and most preferably about 5,000 angstroms. In general, the photoresist thickness is selected such that some photoresist remains over the hard mask 150 as shown in FIG. 5C.

Figure 5B:
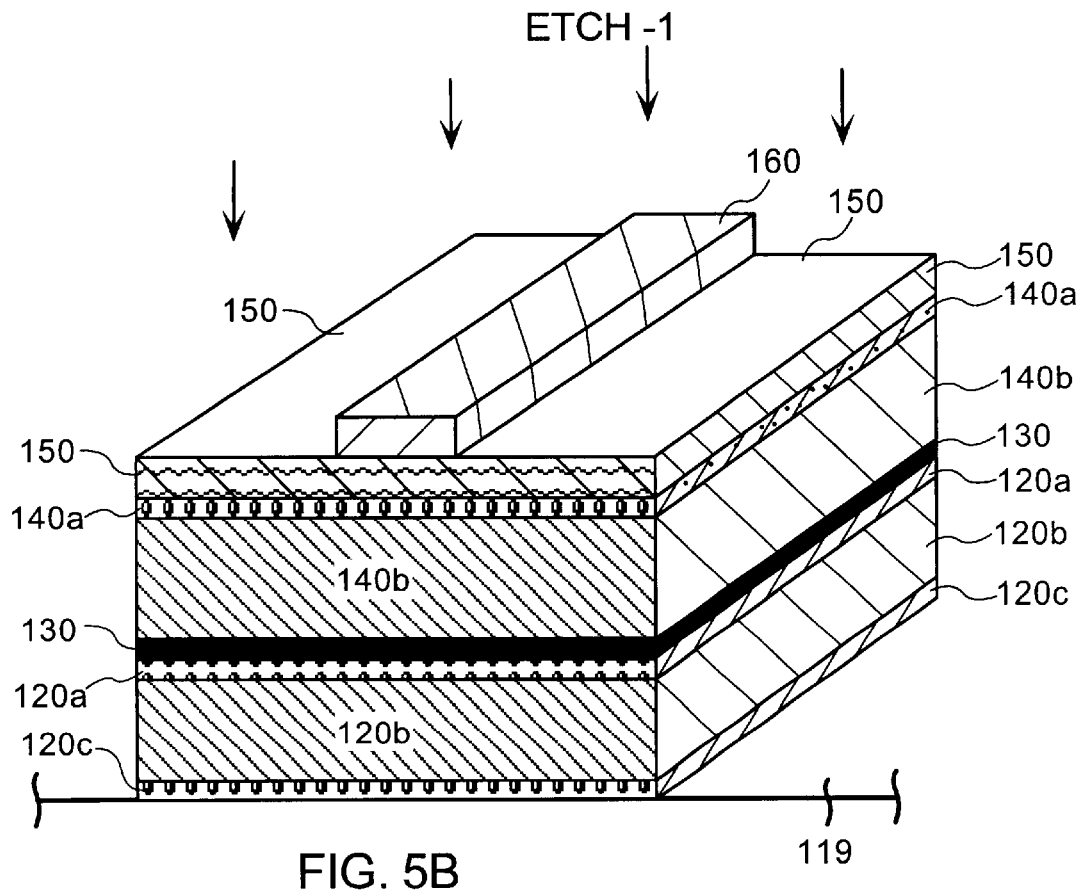
FIG. 5B is a three dimensional view of the top most layers deposited over the first dielectric layer in accordance with one embodiment of the present invention.

FIG. 5B is a three dimensional view of the top most layers deposited over the first dielectric layer 119 in accordance with one embodiment of the present invention. For ease of understanding, only the top most layers will be shown in FIGS. 5B through 5K to illustrate the advantageous self-aligning features of conductive vias formed over a lower metallization line. At this point, photoresist layer 160 has been patterned using conventional photolithography techniques to define an outline of the desired metallization interconnect line feature geometries patterned from layers 120a, 120b, and 120c (e.g., as shown in FIG. 5K below). Once photoresist layer 160 is patterned as shown, the semiconductor wafer is subjected to two etching operations (Etch-1). The first etching operation takes advantage of an $O_2/CHF_3$ chemistry (described in table C below), which is well suited for etching through exposed regions of hard mask 150 layer. Once the hard mask layer 150 etch is complete, a second $Cl_2/BCL_3$ etch chemistry (described in table A below) is used to etch through the top barrier layer 140a and conductive via metallization layer 140b. However, as mentioned above, etch stop layer 130 is preferably well suited to stop the etching chemicals from removing any more material once the conductive via metallization layer 140b is removed.

Figure 5C:
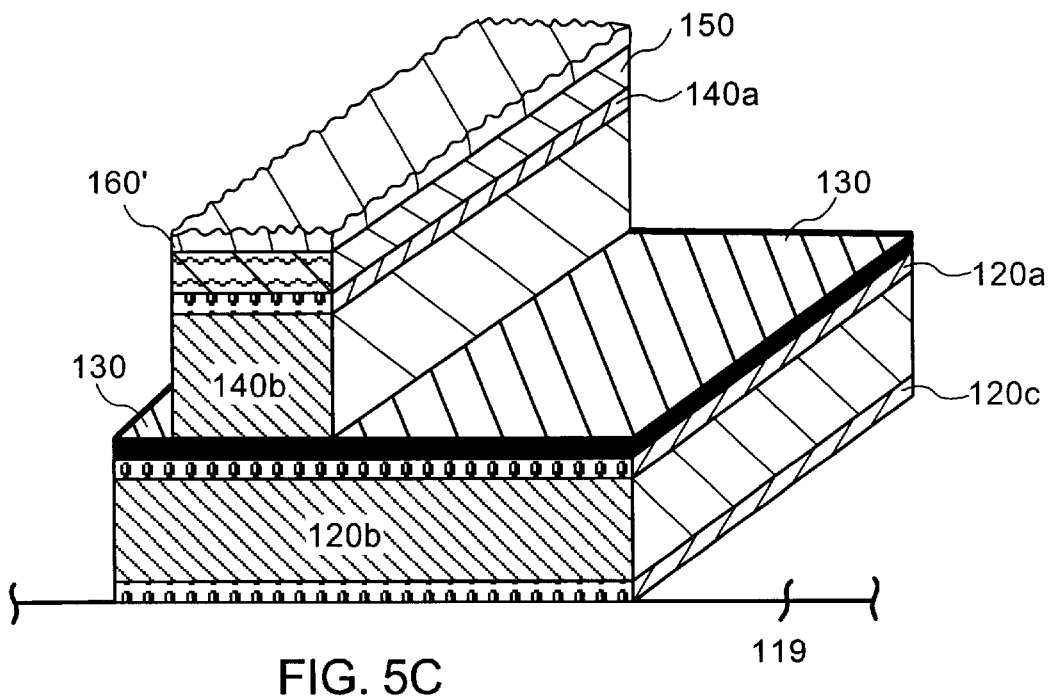
FIG. 5C shows the resulting structure after etching operations are performed in FIG. 5B in accordance with one embodiment of the present invention.

FIG. 5C shows the resulting structure after the etching operations of Etch-1 are performed in FIG. 5B in accordance with one embodiment of the present invention. This perspective therefore illustrates that the conductive via metallization layer 140b and top barrier layer 140a are completely removed in those regions where the patterned photoresist layer 160 was not protecting the underlying surface. After the Etch-1 process, a photoresist layer 160' will remain having a thickness of between about 1,000 angstroms and about 2,500 angstroms, and most preferably about 2,000 angstroms. Most importantly, the etch chemistries used to etch through hard mask layer 150, top barrier layer 140a and conductive via metallization layer 140b do not substantially penetrate etch stop layer 130 because the second $Cl_2/BCL_3$ etch chemistry does not etch titanium tungsten (TiW), tungsten (W), or tungsten silicide ($WSi_2$) well.

Figure 5D:
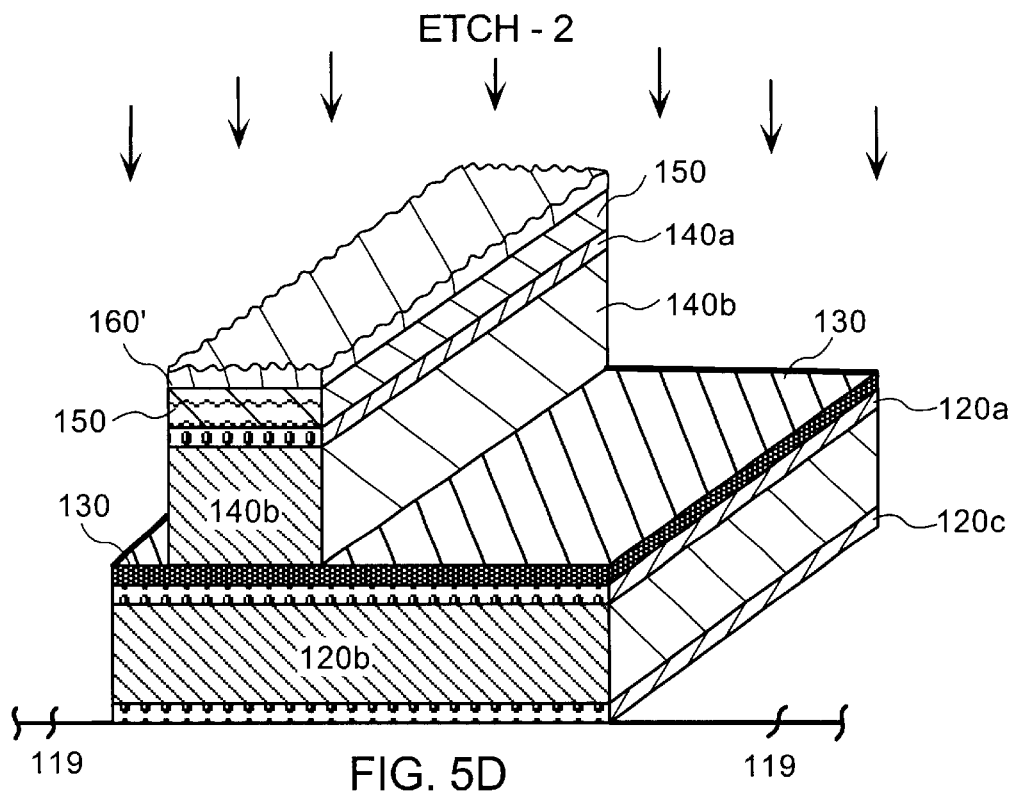
FIG. 5D illustrates another etching operation used to remove a portion of the etch stop layer in accordance with one embodiment of the present invention.

FIG. 5D illustrates another etching (Etch-2) operation used to remove the etch stop layer 130 in accordance with one embodiment of the present invention. Preferably, a $BCl_3/SF_6$ chemistry described in table B below is used to remove etch stop layer 130. Once Etch-2 removes the etch stop layer 130 over regions not protected by the patterned photoresist 160' and hard mask 150, the top barrier layer 120a will be exposed. During Etch-2, most of the patterned photoresist 160' will be substantially removed, but the underlying hard mask 150 will also assist in protecting the top barrier layer 140a and the conductive via metallization layer 140b. However, to ensure that no photoresist 160' remains, a conventional resist stripping operation is performed before proceeding to the next operation.

Figure 5E:
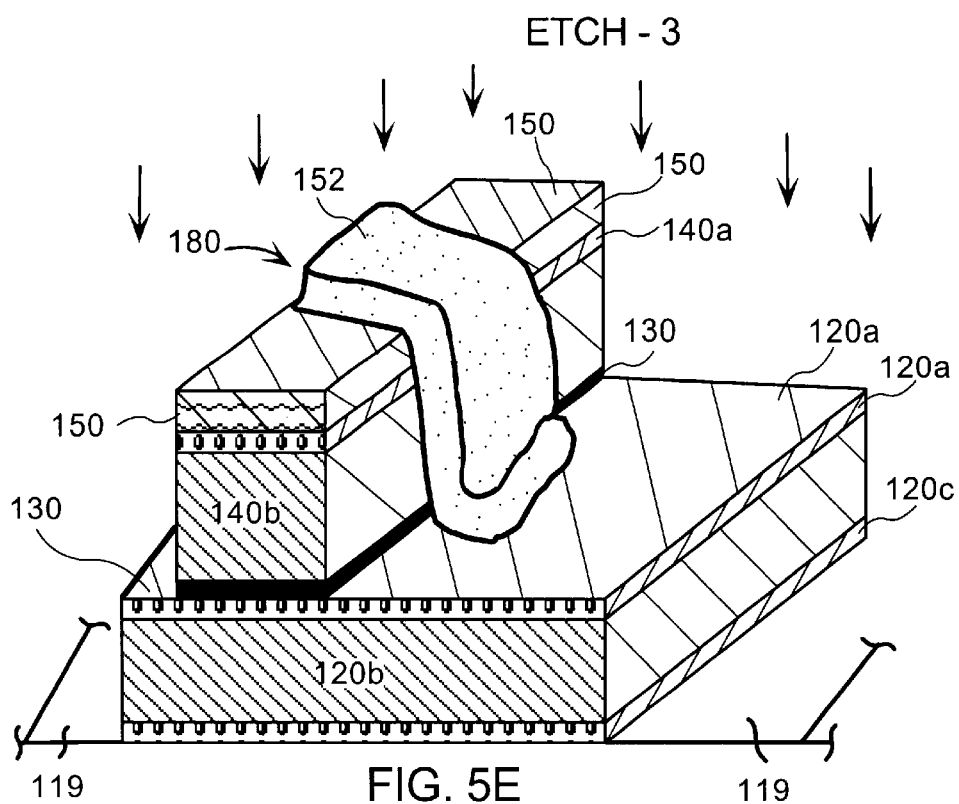
FIG. 5E shows a via photoresist mask pattern formed over the remaining hard mask layer and another etching operation in accordance with one embodiment of the present invention.
Figure 6A:
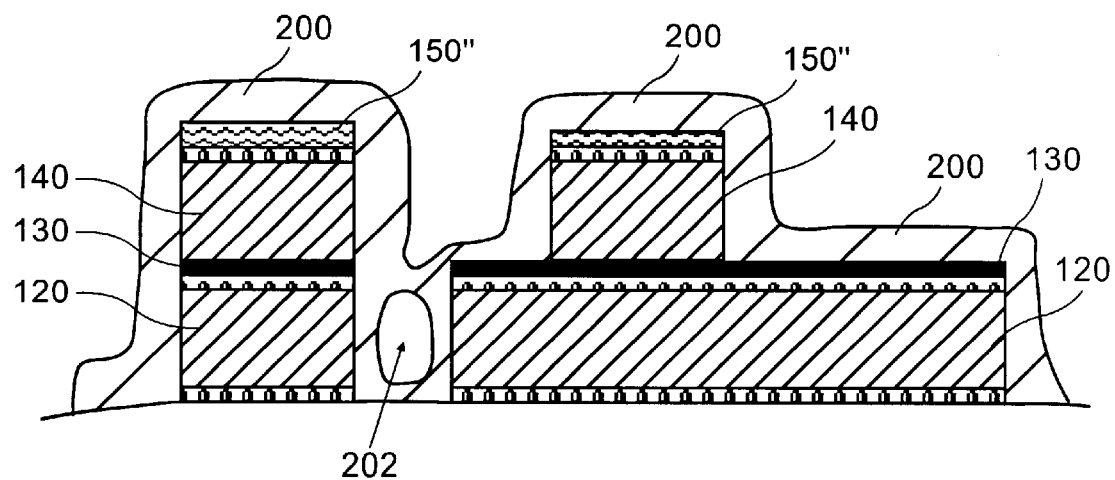
FIGS. 6A–6C illustrate a method for making air-gaps between metallization layers and self-aligned vias.

FIG. 5E shows a photoresist mask pattern 152 formed over hard mask layer 150 and another etching operation (Etch-3) in accordance with one embodiment of the present invention. Photoresist mask pattern 152 is preferably patterned over a portion of hard mask 150 to protect selected regions of hard mask 150 from the Etch-3 operation, which is used to define the location of self-aligned conductive vias. Specifically, the resulting conductive vias (i.e., formed form conductive via metallization layer 140b and top barrier layer 140a) will lie under the photoresist mask pattern 152. As shown, the photoresist mask experienced a slight misalignment (i.e., shift to the right). These misalignments are common, and are becoming ever more severe with the need to pattern increasingly smaller features within very tight tolerances. As such, a part of the photoresist mask 152 will be applied over parts of top barrier layer 120a and the side wall of conductive via metallization layer 140b and top barrier layer 140a. Therefore, part of the hard mask 150 on the left side will be unprotected, thereby causing the formation of thinner conductive via structure as illustrated in FIG. 6A below. Once patterned with the photoresist, the Etch-3 is preferably used to remove regions of hard mask 150 that are un-covered with the photoresist mask pattern 152. As such, Etch-3 implements the aforementioned $O_2/CHF_3$ chemistry described in table C below.

Figure 5F:
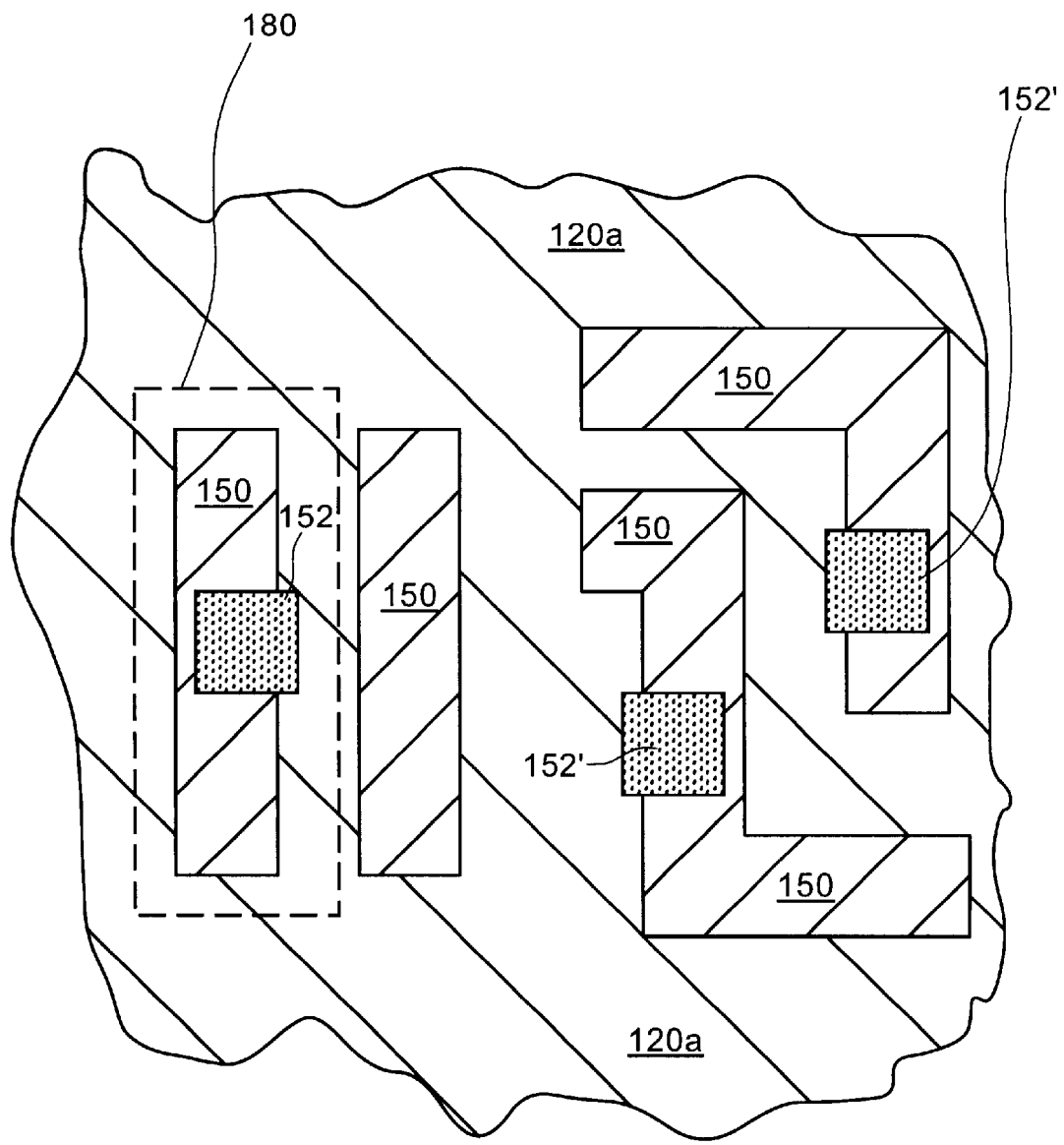
FIGS. 5F through 5I are top views illustrating other representative interconnect patterns that may be defined throughout a surface of a semiconductor device and associated via photoresist mask patterns in accordance with one embodiment of the present invention.

FIG. 5F is a top view illustrating other representative patterns (i.e., interconnect lines) that may be defined throughout a surface of a semiconductor device. In this example, a region 180 illustrates the exemplary photoresist pattern 152 defined over hard mask layer 150, and a portion of top barrier layer 120a. Also shown are other regions where conductive vias will ultimately reside under the photoresist mask patterns 152'. Because the resulting via structures of the present invention are self-aligned, and will not be defined outside of the contours (i.e., outline) of the underlying hard mask layer 150 (i.e., as shown in FIG. 5K), the leakage currents and short circuit problems of the prior art will no longer be present.

Figure 5G:
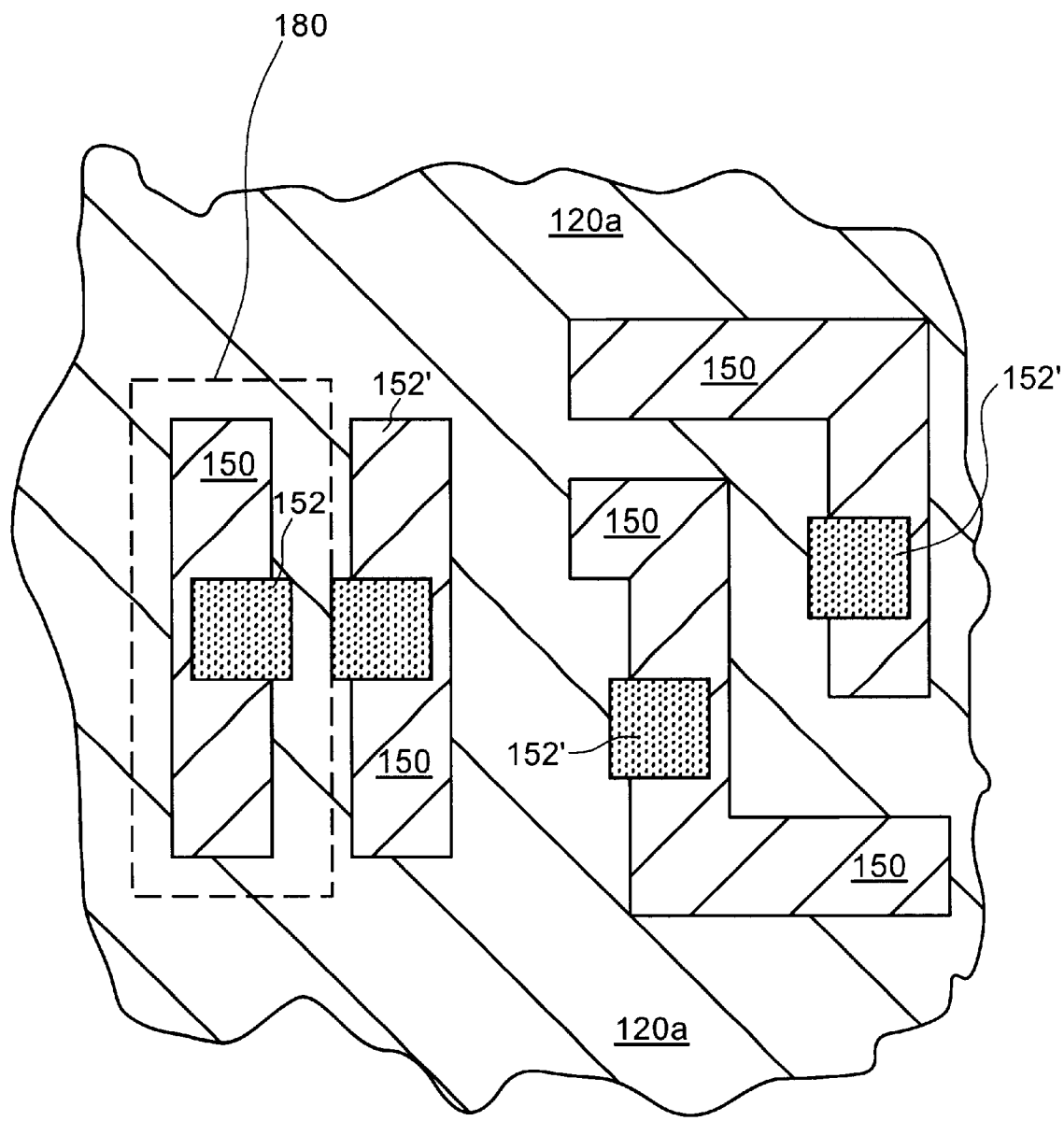
Figure 6B:
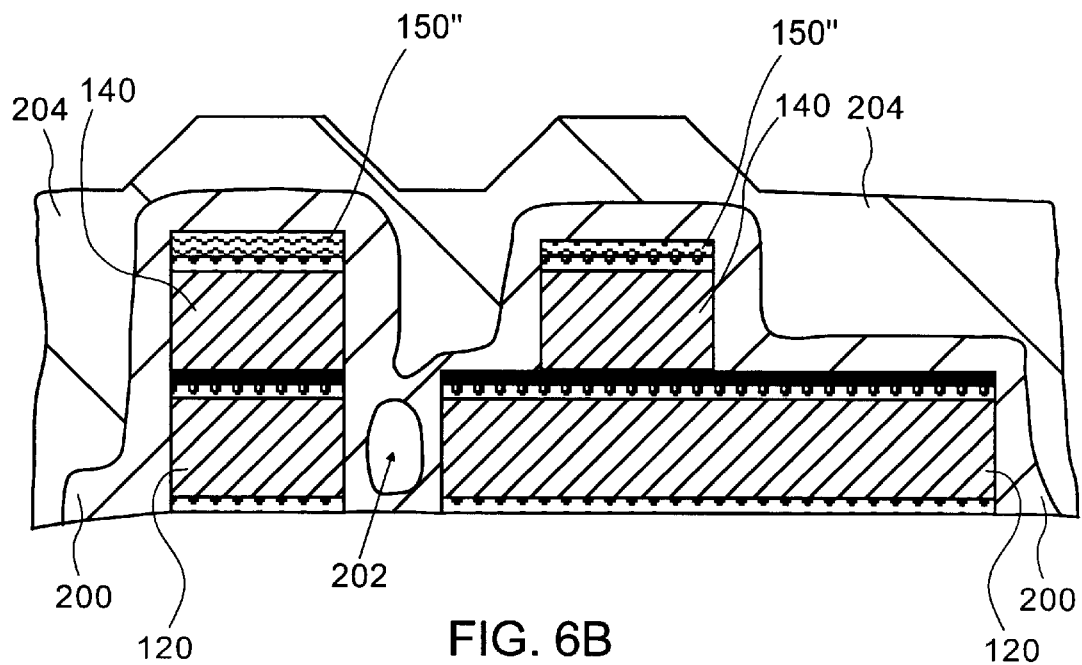

FIG. 5G is the top view of FIG. 5F showing a photoresist pattern 152' defined next to the photoresist pattern 152 on an adjacent interconnect line. As shown in FIG. 6B below, even when adjacent conductive vias are designed in close proximity to each other, and the photoresist patterns nearly meet, the resulting conductive vias 140 will still be perfectly aligned with the underlying interconnect lines 120.

Figure 5H:
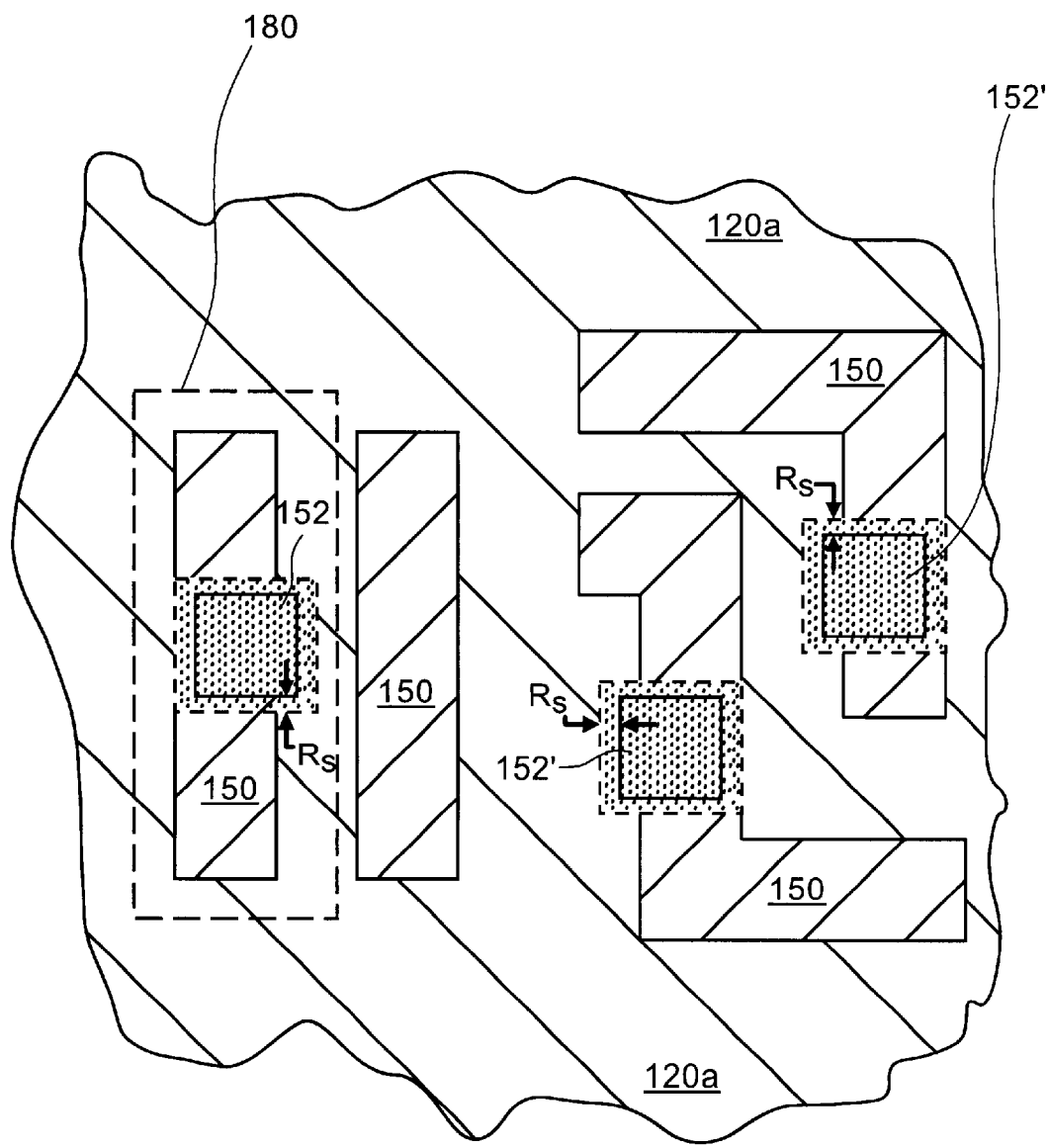

In another embodiment, to avoid producing thinner vias caused by misalignments, the designer may simply implement a re-sizing of the reticle patterns used to define photoresist mask patterns 152 and 152'. As shown in FIG. 5H, a re-size (Rs) is implemented to increase the size of the reticle mask used to pattern the photoresist layer, and to define a photoresist mask 152 and 152' that has a larger shape. In this manner, the resulting photoresist mask pattern 152 shown in FIG. 5E may completely cover the top surface of hard mask layer 150, where the resulting conductive via will reside after and Etch-4 is performed in FIG. 5J below.

Figure 5I:
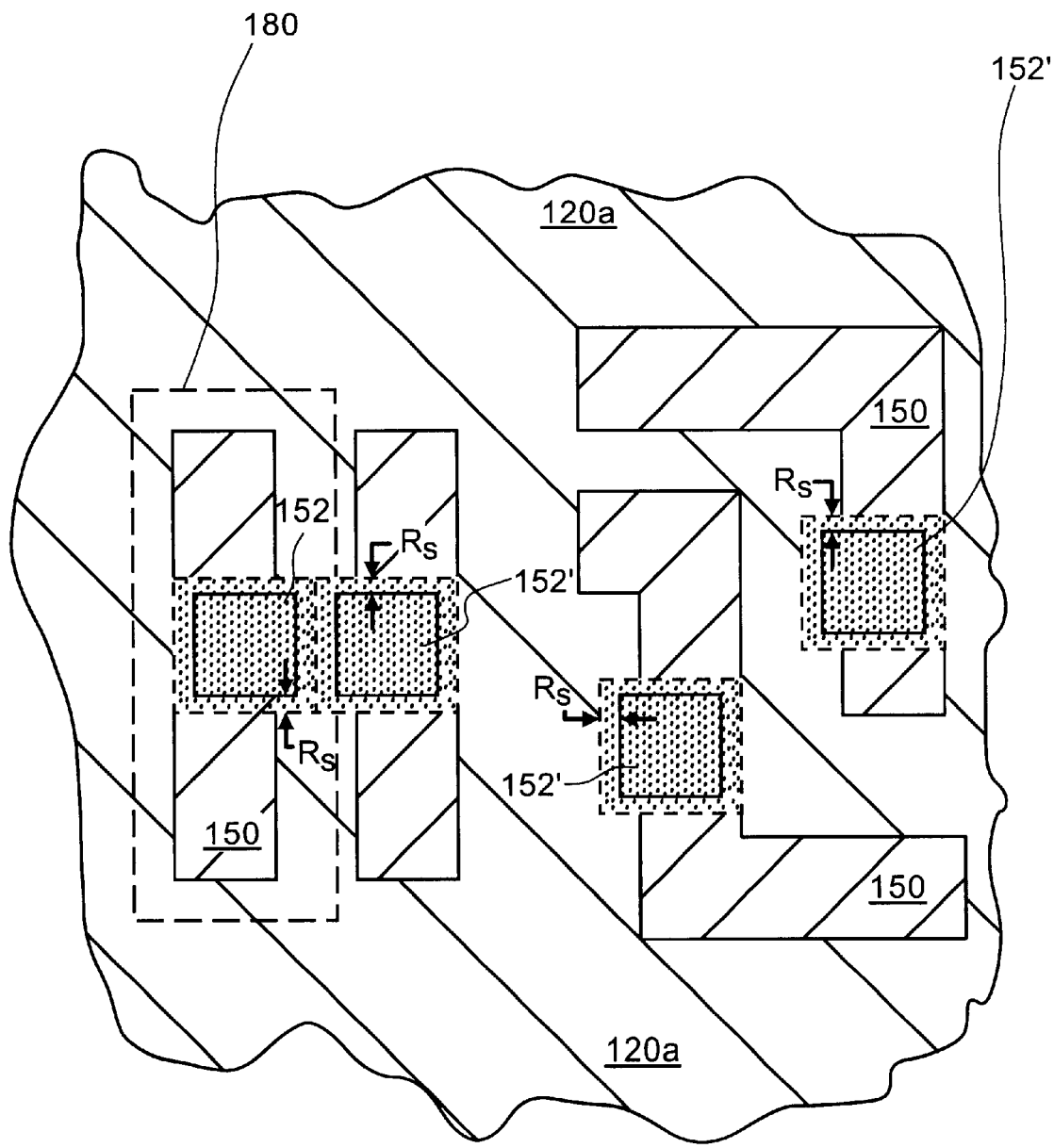
Figure 5J:
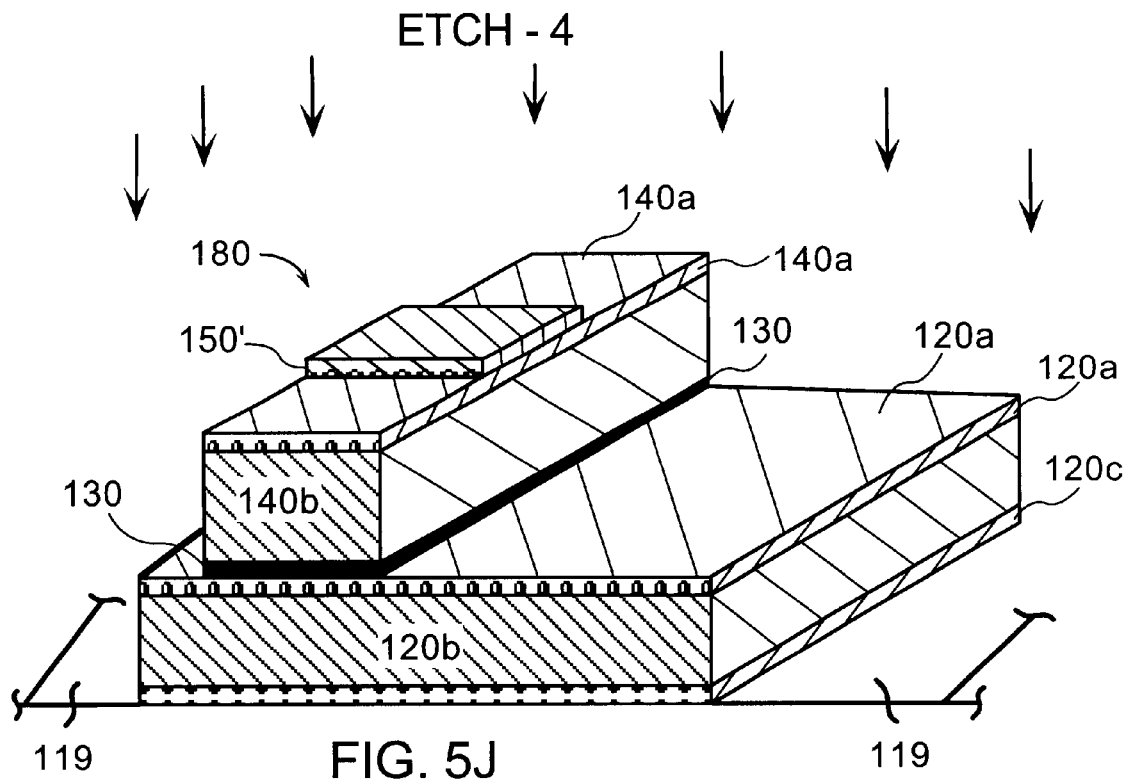
FIG. 5J illustrates the remaining hard mask pattern used to define the location of the conductive via structures in accordance with one embodiment of the present invention.
Figure 5K:
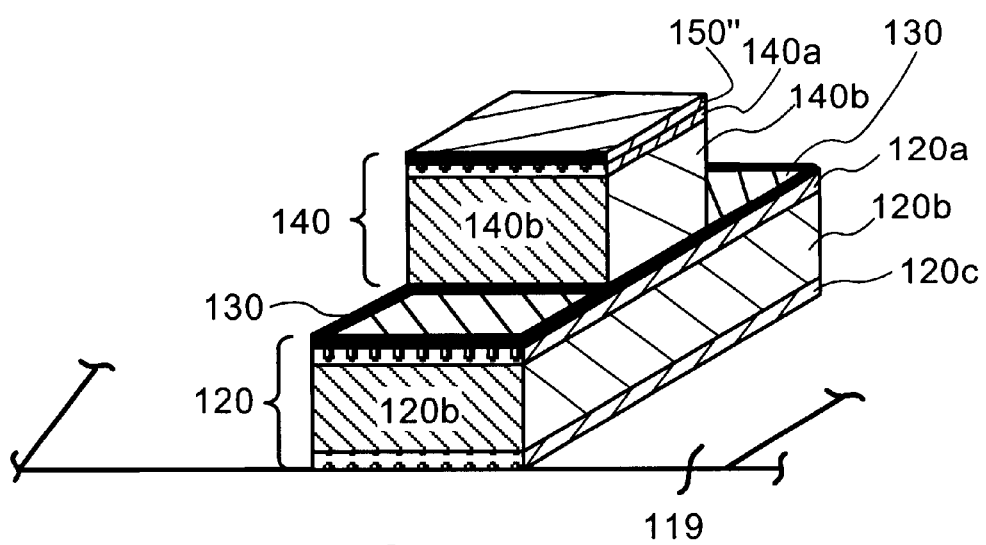
FIG. 5K illustrates the resulting interconnect line and aligned conductive via structure formed over the interconnect line in accordance with one embodiment of the present invention.

FIG. 5I is the top view of FIG. 5G after a re-sizing is performed to increase the size of the photoresist patterns 152 and 152'. However, because there are two adjacently positioned photoresist patterns 152 and 152' on adjacent interconnect lines, the photoresist material will tend to merge. In prior art designs, when the via masks merged due to misalignments, the conductive vias would necessarily be formed as one large conductive via that would produce an erroneous electrical interconnection (i.e., the two adjacent interconnect lines would be accidentally shorted together). It is therefore important to realize that even if the photoresist patterns 152 and 152' merge as shown in FIG. 5I, the resulting vias will still be spaced apart and perfectly aligned as shown in FIG. 6D below.

Figure 1A:
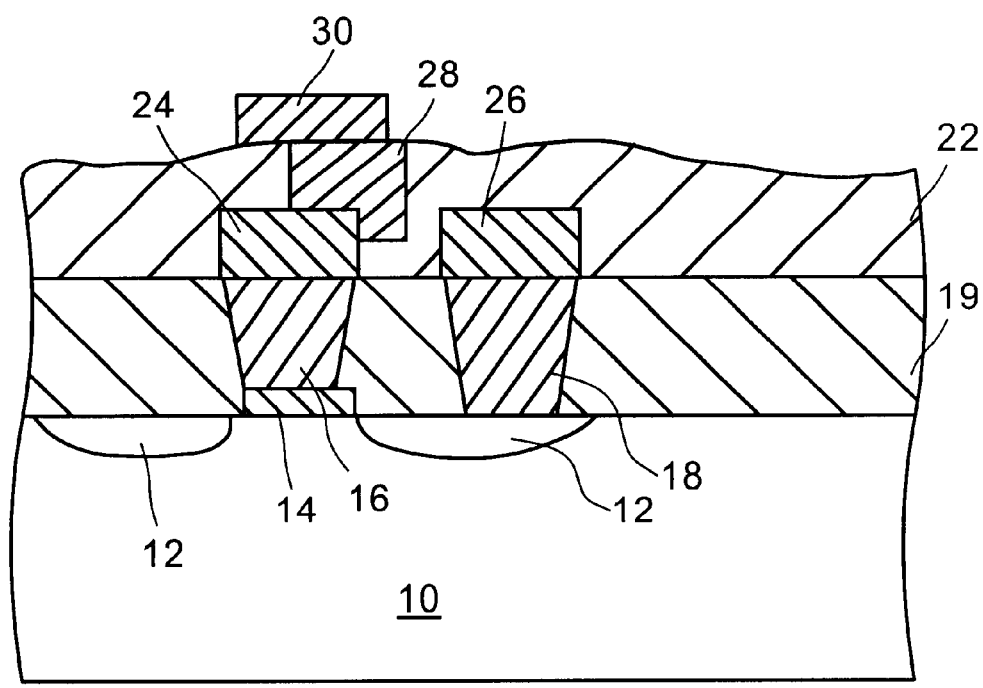
FIG. 1A is a cross sectional view of a conventional semiconductor device having a misaligned metal contact.
Figure 1B:
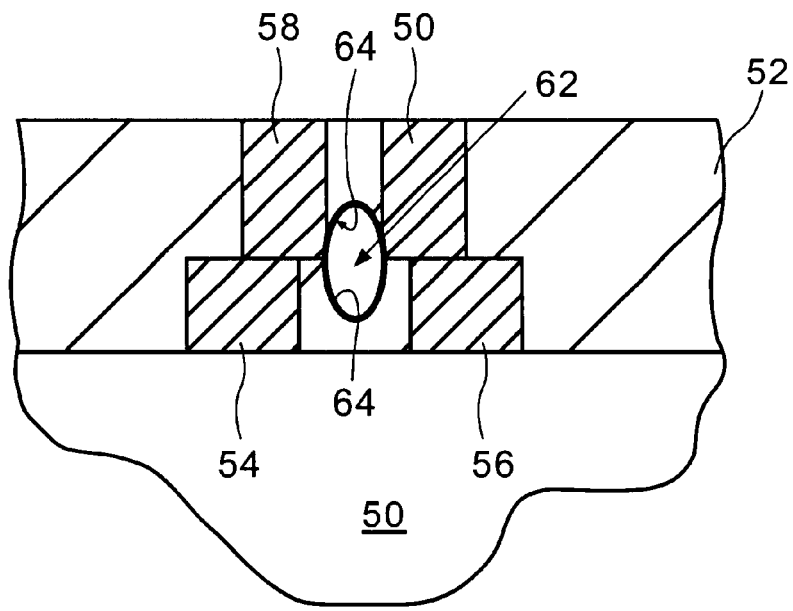
FIG. 1B illustrates a case in which misalignments can cause openings in airgaps formed between metallization lines.
Figure 1C:
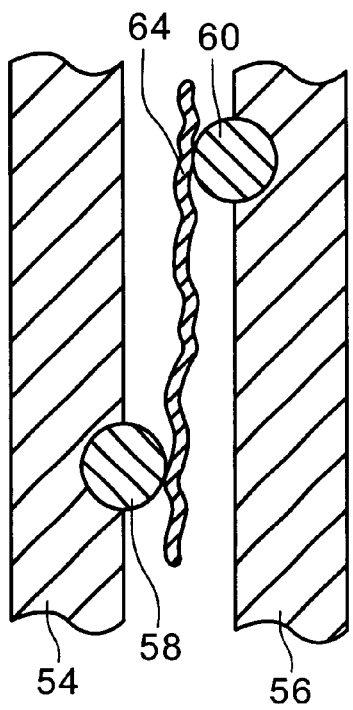
FIG. 1C is a top view of FIG. 1B, in which the conductive via formation caused the deposition of tungsten within the air-gap and resulted in an electrical short.

In FIG. 5J, once the photoresist material is stripped off, a hard mask pattern 150' will remain over top barrier layer 140a, thereby defining a region underlying the hard mask pattern 150', where a resulting conductive via 140 will reside as shown in FIG. 5K. Accordingly, during the Etch-4 operation, all regions not covered by hard mask pattern 150' and etch stop layer 130 will be removed, thereby defining a conductive interconnect line 120 and a conductive via 140 (with a remaining hard mask 150"). That is, Etch-4 is preferably a $Cl_2/BCl_3$ chemistry (described in table A below) that is well suited to etch through conductive via metallization layer 140b and top barrier layer 140a down to the etch stop layer 130, and through top barrier layer 120a, interconnect metallization layer 120b, and bottom barrier layer 120c down to the fist dielectric layer 119. As a result, FIG. 5K shows a resulting conductive interconnect line 120 having an overlying conductive via 140 that is perfectly self-aligned with the underlying conductive interconnect line 120. It should be appreciated that no via overlapping is experienced past the edge of conductive interconnect line 120 as in prior art FIGS. 1A–1C.

FIG. 6A illustrates a cross-sectional view of an interconnect line 120 on a first metallization level having self-aligned conductive vias 140, in accordance with one embodiment of the present invention. In this embodiment, in order to form conductive lines 120 having air gaps between adjacent metallization lines, a non-conformal oxide 200 is deposited over the interconnect lines 120 and the conductive vias 140. As shown, the non-conformal oxide 200 will form an air gap 202 between adjacent metallization interconnect lines 120. The air gaps 202 will therefore enable the performance of the interconnect lines to increase to higher speeds due to the reduced intra-feature capacitance. In this embodiment, the non-conformal oxide 200 is preferably a plasma-enhanced chemical vapor deposited (PECVD) oxide which will non-conformally deposit over both the interconnect line 120 and the conductive vias 140. Alternatively, the non-conformal oxide 200 can also be deposited using a high density plasma (HDP) deposition operation that operates in a chamber without the application of a bias power. In either case, the non-conformal oxide 200 should be configured to leave air gaps 202 between adjacent interconnect lines 120.

In this preferred embodiment, the separation between interconnect lines 120 is preferably between about 2,000 Å and about 8,000 Å, and most preferably about 4,000 Å. Of course, the separation really depends on the particular IC design and the micron technology being implemented. It should be noted that as the separation between the interconnect lines 120 grows, the harder it will be to create the air gaps 202 between the interconnect lines 120. In this preferred embodiment, the non-conformal oxide 200 is preferably deposited to a thickness that is between a range of 1,000 Å and about 5,000 Å, and most preferably about 2,500 Å.

FIG. 6B illustrates the structure of FIG. 6A after an HDP deposition operation is performed in accordance with one embodiment of the present invention. The HDP deposition is configured to deposit an oxide 204 over the non-conformal oxide 200. As is well known, the HDP deposition will be configured to fill high aspect ratio regions without the formation of voids. Thus, the oxide 204 should be configured to be deposited to a level that is higher than the topmost portion of the conductive vias 140. Once the oxide 204 has been deposited, the structure can be processed through a chemical mechanical polishing (CMP) operation to planarize the top surface of the deposited oxide layers.

Figure 6C:
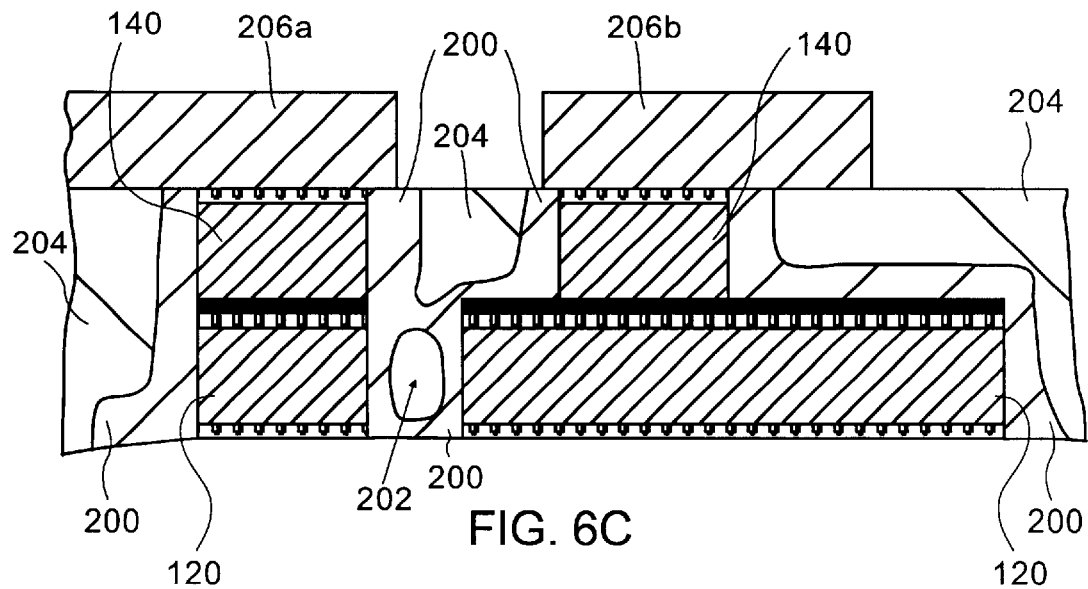

Preferably, the CMP operation will be configured to remove the topmost portion of the oxide layer 204 and the non-conformal oxide 200 from over the conductive vias 140. It is also preferred that during the CMP operation, the hard mask 150" be removed to expose the metallization of the conductive vias 140 as illustrated in FIG. 6C. Once the CMP operation has been performed, a metallization layer 206 can be deposited over the entire surface and then followed by a patterning operation.

The patterning operation will be configured to define metallization features 206a and 206b, each in conductive contact with the conductive vias 140. In a most preferred embodiment, the conductive metallization lines 206a and 206b will also be a sandwich of metallization material as discussed with reference to interconnect lines 120. As a result of implementing the self-aligned conductive vias of the present embodiment, it is also possible to integrate air gaps 202 between the interconnect lines 120 without the worry of having misalignments in the conductive vias may infringe upon the air gaps 202. That is, because there will be no misalignment between the interconnect lines 120 and the conductive vias 140, the air gaps 202 will not be exposed to misaligned via holes that may introduce gasses, processing chemicals, and the like, into the air gaps 202. Additionally, the problem of having the air gaps deposited with tungsten during the tungsten deposition operations will also be eliminated, thus avoiding the risk of shorts along the interconnect lines 120.

Figure 7A:
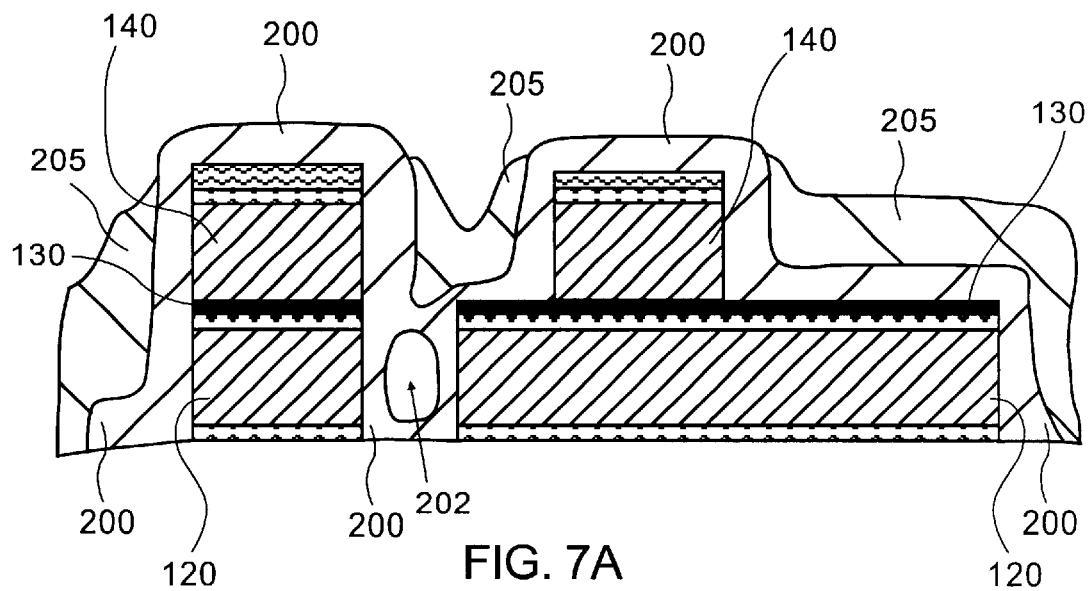
FIGS. 7A–7C illustrate an alternative method for depositing oxides layers to form air-gaps between metallization lines and self-aligned vias.

FIG. 7A illustrates another embodiment of the present invention in which air gaps 202 are used along with self-aligned via structures. In this embodiment, after the non-conformal oxide 200 is deposited to form the air gaps 202, a hydrogen silsesquioxane (HSQ) layer is spin-coated over the non-conformal oxide 200. Thus HSQ layer 205 is essentially a spin-on-glass (SOG) material which is designed to fill in higher aspect regions throughout the structure being spin-coated (or even out surfaces having large topographical variations). In this example, the HSQ layer 205 has filled in the region between the conductive vias 140.

Figure 7B:
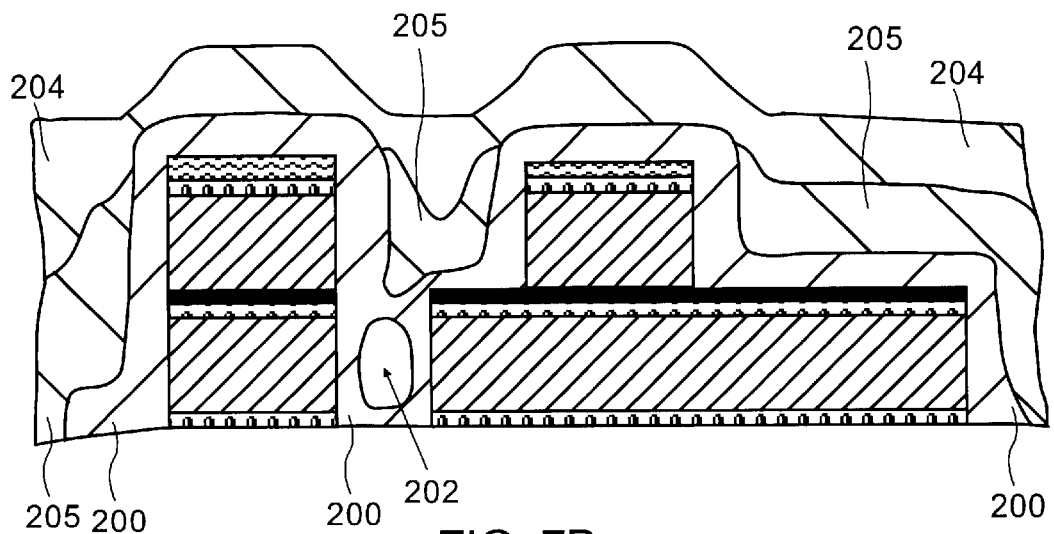
Figure 7C:
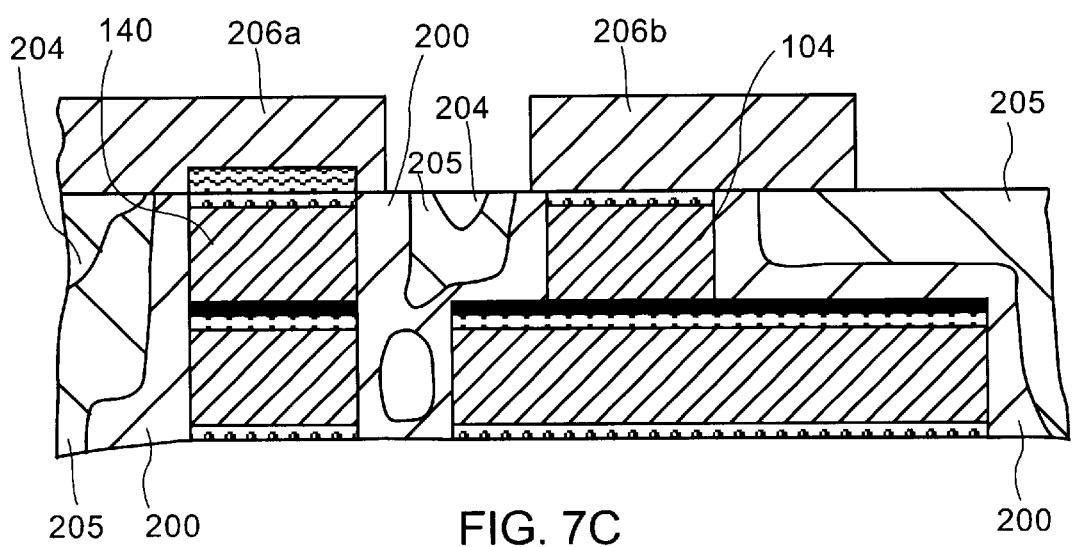

Once the HSQ layer is spin-coated, the method will proceed as shown in FIG. 7B to an IDP deposition. The HDP deposition will therefore deposit an oxide 204 over the HSQ layer 205 as well as the non-conformal oxide 200. Now that the HDP oxide 204 has been deposited, a CMP operation is used to planarize the top surface of the deposited oxides as shown in FIG. 7C. As mentioned above, the CMP operation is preferably configured to remove the oxide down to the topmost metallization portion of the conductive vias 104. Accordingly, the hard mask 150" is removed such that a good conductive contact can be made to a subsequently deposited and patterned metallization lines 206a and 206b.

Tables A through C below are provided to illustrate the exemplary parameters used in performing the various plasma chamber etching operations described as Etch-1, Etch-2, Etch-3, and Etch-4. Although any type of plasma etcher may be used, preferred etchers may be obtained from Lam Research Corporation of Fremont, Calif. In a specific example, a LAM Research 9600 SE may be used to perform the etching operations of Table A and Table B. In a like manner, a LAM Research 4520XL may be used to perform the etching operations of Table C. Further, although the following parameters are associated with an exemplary "6 inch wafer," the parameters may be modified for application to substrates of varying sizes and shapes, such as those employed in the manufacture of semiconductor devices. Further yet, it should be understood that the advantageous self-aligning conductive vias described herein may be fabricated in 0.35, 0.25, 0.18, 0.15 and smaller micron technology processes.

TABLE A

Exemplary Etch Chemistry A $Cl_2/BCL_3$

| | Top Power (watts) | Bottom Power (watts) | Flow Rate | | Pressure | Temp |
|---|---|---|---|---|---|---|
| Approximate Range | 250 to 700 | 50 to 300 | 30–90 sccms $Cl_2$ | 10–60 sccms $BCL_3$ | 5 mTorr– 40 mTorr | 20° C. to 90° C. |
| Approximate Preferred Range | 350 to 550 | 100 to 250 | 40–80 sccms $Cl_2$ | 20–40 sccms $BCL_3$ | 10 mTorr– 30 mTorr | 30° C. to 70° C. |
| Approximate More Preferred Range | 450 | 175 | 60 sccms $Cl_2$ | 30 sccms $BCL_3$ | 20 mTorr | 50° C. |

TABLE B

Exemplary Etch Chemistry B $BCl_3/SF_6$

| | Top Power (watts) | Bottom Power (watts) | Flow Rate SCCM | | Pressure | Temp |
|---|---|---|---|---|---|---|
| Approximate Range | 250 to 700 | 50 to 300 | 10–50 sccms $BCl_3$ | 5–50 sccms $SF_6$ | 5m␣Torr– 40 mTorr | 20° C. to 90° C. |
| Approximate Preferred Range | 400 to 500 | 100 to 200 | 20–40 sccms $BCl_3$ | 7–40 sccms $SF_6$ | 10 mTorr– 25 mTorr | 30° C. to 70° C. |
| Approximate More Preferred Range | 450 | 150 | 30 sccms $BCl_3$ | 15 sccms $SF_6$ | 15 mTorr | 50° C. |

TABLE C

Exemplary Etch Chemistry C $O_2/CHF_3$

| | Top Power (watts) | Bottom Power (watts) | Flow Rate | | Pressure | Temp |
|---|---|---|---|---|---|---|
| Approximate Range | 200 to 1000 | 300 to 2000 | 20–100 sccms $O_2$ | 2–15 sccms $CHF_3$ | 100 mTorr– 400 mTorr | 0° C. to 40° C. |
| Approximate Preferred Range | 300 to 700 | 500 to 1500 | 30–60 sccms $O_2$ | 3–7 sccms $CHF_3$ | 150 mTorr– 250 mTorr | 5° C. to 15° C. |
| Approximate More Preferred Range | 500 | 800 | 45 sccms $O_2$ | 5 sccms $CHF_3$ | 200 mTorr | 10° C. |

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An interconnect structure, comprising:
    a first metallization layer having a plurality of metallization lines;
    a conductive via metallization layer defined over the first metallization layer, the conductive via metallization layer defining self-aligned conductive vias;
    a non-conformal oxide layer defined over the first metallization layer and the conductive via metallization layer defining air gaps positioned between the plurality of metallization lines; and
    a cap oxide layer defined over the non-conformal oxide.

2. An interconnect structure as recited in claim 1, wherein the non-conformal oxide is one of a PECVD oxide and a non-biased HDP oxide.

3. An interconnect structure as recited in claim 1, further comprising:
    an HSQ layer disposed over the non-conformal oxide layer and under the cap oxide layer.

4. An interconnect structure as recited in claim 1, wherein the cap oxide layer is an HDP oxide.

5. An interconnect structure as recited in claim 1, wherein a separation between the plurality of metallization lines varies between about 2,000 angstroms and about 8,000 angstroms.

6. An interconnect structure as recited in claim 1, wherein the non-conformal oxide layer has a thickness that is between about 1,000 angstroms and about 5,000 angstroms.

7. An interconnect structure as recited in claim 1, wherein the first metallization layer is defined at any level of an interconnect structure and the conductive via metallization layer is defined over the first metallization layer.

8. An interconnect structure of a semiconductor chip, comprising:
    a metallization layer having a plurality of metallization lines defined over an under-layer;
    a conductive via metallization layer defined over the first metallization layer, the conductive via metallization layer defining self-aligned conductive vias;
    a non-conformal oxide layer defined over the first metallization layer and the conductive via metallization layer defining air gaps positioned between at least some of the plurality of metallization lines; and
    an HDP oxide layer defined over the non-conformal oxide, the HDP oxide layer being configured to fill topographical variations between the conductive via metallization layer.

9. An interconnect structure of a semiconductor chip as recited in claim 8, wherein the non-conformal oxide is one of a PECVD oxide and a non-biased HDP oxide.

10. An interconnect structure of a semiconductor chip as recited in claim 9, further comprising:
    an HSQ layer disposed between the non-conformal oxide layer and the HDP oxide layer.

11. An interconnect structure of a semiconductor chip as recited in claim 8, wherein a separation between the plurality of metallization lines varies between about 2,000 angstroms and about 8,000 angstroms.

12. An interconnect structure as recited in claim 8, wherein the non-conformal oxide layer has a thickness that is between about 1,000 angstroms and about 5,000 angstroms.

13. An interconnect structure as recited in claim 8, wherein the under-layer is at least a portion of a metallization line, a conductive view and an insulating layer.

* * * * *